United States Patent [19]

McVey et al.

[11] 4,352,144
[45] Sep. 28, 1982

[54] CAPACITIVE KEYSWITCH WITH OVERTRAVEL PLUNGER MECHANISM

[75] Inventors: John K. McVey, Bensenville; Edward W. Wanatowicz, Jr., Elk Grove Village, both of Ill.

[73] Assignee: Illinois Tool Works Inc., Chicago, Ill.

[21] Appl. No.: 226,583

[22] Filed: Jan. 21, 1981

[51] Int. Cl.³ .............................................. H01G 5/16
[52] U.S. Cl. .............................. 361/288; 200/DIG. 1; 361/293
[58] Field of Search ............................. 361/288, 290; 200/DIG. 1; 340/365 C; 400/479.1

[56] References Cited

U.S. PATENT DOCUMENTS

| | | | |
|---|---|---|---|
| 3,183,912 | 5/1965 | Mogilner | 361/290 X |
| 3,943,812 | 3/1976 | Nagai | 361/288 X |
| 4,090,229 | 5/1978 | Cencel et al. | |

Primary Examiner—Elliot A. Goldberg
Attorney, Agent, or Firm—Donald D. Mondul; Thomas W. Buckman

[57] ABSTRACT

A capacitive keyswitch is formed by a flat, horizontal capacitor plate that is covered by a dielectric layer on a printed circuit board and a moveable capacitor plate that is secured to the printed circuit board by a pair of tabs and is hinged so that it projects upwardly at an acute angle with respect to the horizontal printed circuit board. The plastic plunger for actuating the switch is formed with an integrally molded cantilever overtravel arm, which preferably is formed as a segment of the circumference of a circle. The arm has an integral transversely projecting cylindrical rod at its end which contacts the moveable capacitor plate during actuation of the keyswitch.

4 Claims, 3 Drawing Figures

U.S. Patent  Sep. 28, 1982  4,352,144
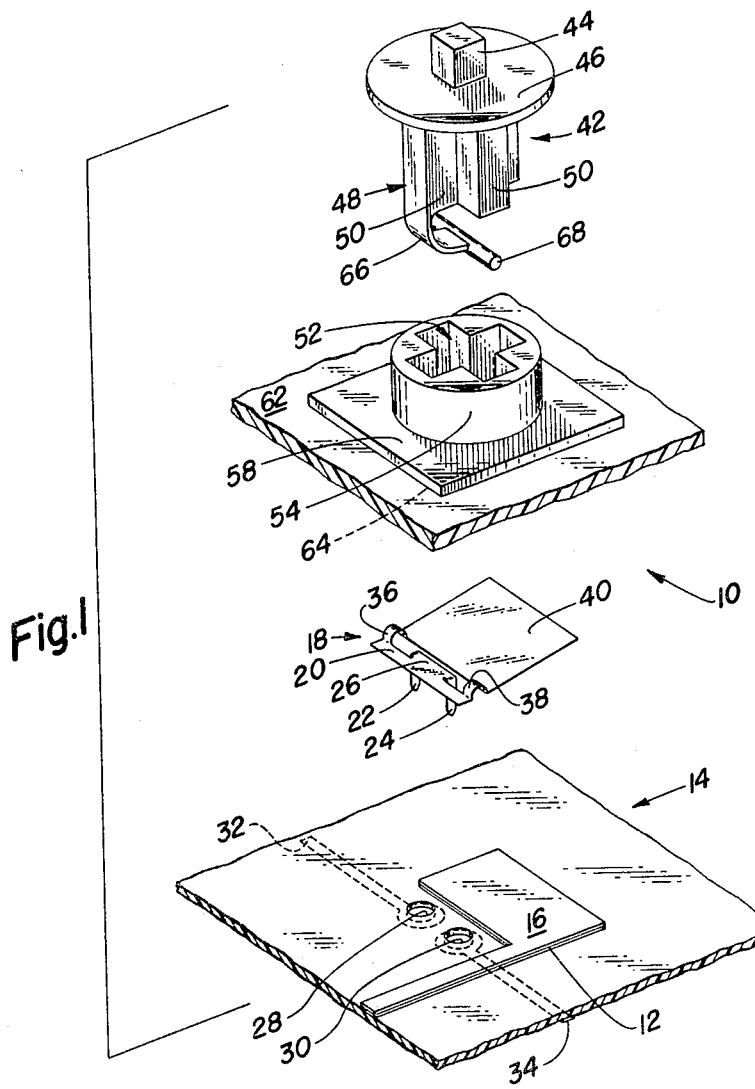
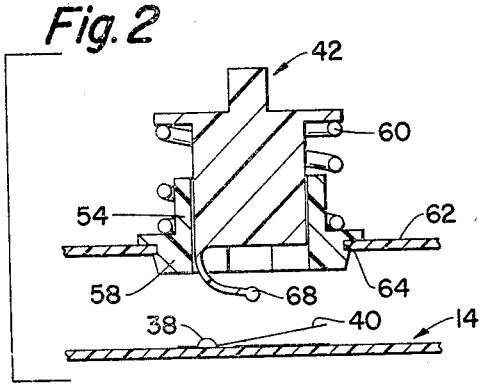
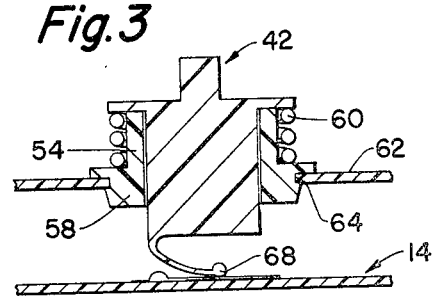

CAPACITIVE KEYSWITCH WITH OVERTRAVEL PLUNGER MECHANISM

BACKGROUND OF THE INVENTION

Electrical keyboards for manual input to data processing system have increasingly adopted capacitive circuitry in recent years since capacitive keyswitches, when properly designed, may provide reliable operation at low cost. In electrical keyboards, however, it is extremely desirable to provide a overtravel mechanism, which means that the key plunger may be depressed beyond the minimum amount which is needed to activate the data processing equipment.

A number of advantages are obtained from such an overtravel mechanism. First, the use of overtravel requires that the plunger will be depressed beyond the minimum amount that is required to insure position of the switching action. Next, the use of overtravel tends to result in a reduction of the bounce that otherwise might occur since the overtravel mechanism acts as a shock absorber when the plunger is depressed. Furthermore, with overtravel, the plunger will be depressed at least a minimum period which helps to discriminate against noise or teasing of the switch.

A simple overtravel mechanism which is formed by a tab cut out of an electrical contact arm that is mounted at an acute angle in a switch is found in the Golbeck et al U.S. Pat. No. 3,916,131, issued Oct. 28, 1975. This same type of inexpensive overtravel mechanism is found in a capacitive switch in the Cencel U.S. Pat. No. 4,090,229 wherein it is combined with a pair of elongated leaf spring hinges which are formed by slots in the metal moveable capacitor plate.

The cut out tab overtravel mechanism of the Golbeck et al and Cencel et al patents is a cost effective means of obtaining overtravel in a capacitive switch. However, since the tab is separated from the remainder of the capacitor plate in the Cencel device, an irregular variation in the capacitance of the keyswitch can occur as the tab is flexed. In a capacitive keyswitch, it is desirable, of course, to minimize any variations that can occur due to slots or openings in the moveable capacitive plate.

The present invention is directed to an overtravel mechanism which eliminates the need for cutting the overtravel tab out of the moveable plate and any undesired capacitance variation associated therewith.

DESCRIPTION OF THE DRAWINGS

The present invention is described by reference to the drawings in which:

FIG. 1 is an exploded view of the fixed and moveable plates and the plunger of a capacitive keyswitch in accordance with the present invention;

FIG. 2 is a side cross-sectional view of the switch with the plunger in an undepressed position; and FIG. 3 is a side cross-sectional view of the switch with the plunger in a depressed condition when the switch is actuated.

TECHNICAL DESCRIPTION OF THE INVENTION

FIG. 1 shows a perspective view of the keyswitch 10 of the present invention. The fixed horizontal capacitor plate 12 is imbedded in the printed circuit board 14 and is covered by a thin dielectric film layer 16. The moveable plate 18 is formed with a flat, elongated support member 20 which carries a pair of downwardly projecting tabs 22, 24 formed on the bracket 26. The tabs 22, 24 correspondingly fit into the apertures 28, 30 in the printed circuit board so they may be soldered therein to make electrical connection to the conductive paths 32, 34 that are imbedded in the board 14. The hinges for the moveable plate 36, 38 may be loop hinges of the adjustable capacitor type employed in early radio circuits, for example, as shown in the Brokaw U.S. Pat. No. 1,729,704. Alternately, straight, flat hinges or hinges of the type shown in the Cencel Patent could be used. The moveable plate 40 of the keyswitch of the present invention is completely solid and has no slit or cut out portions and, therefore, undesired capacitance variations are eliminated.

The actuating plunger mechanism 42 for the keyswitch is preferably formed as a molded plastic member which has a key receiving post 44 on its upper end, a spring support ring 45 and a lower plunger section 48. The lower plunger section 48 is formed of four ribs 50 which are aligned to form a cross pattern which projects into a corresponding cross-shape aperture 52 that is formed in the guide boss 54 which projects from the base 58. As shown in FIG. 2a return spring 60 is positioned between the bottom of the ring 46 and the top of base 58. A support board 62 fits into the slotted groove 64 in the base 58 to support the actuating mechanism above the moveable capacitor plate.

The overtravel mechanism of the keyswitch is formed by a cantilever mounted resilient integrally formed curvilinear arm 66 that extends from the bottom of one of the ribs of the plunger. The shape of the arm 66 is preferably a segment of the circumference of a circle. At the end of the arm there is a transversely mounted cylindrical rod 68 which extends outwardly beyond the width of the generally flat curvilinear arm 66. When the plunger is depressed and the keyswitch is actuated, the surface of the rod 68 bears against the moveable capacitive plate 40, as shown in FIGS. 2 and 3, thus forcing the moveable capacitor plate to a position approximately parallel to the fixed capacitor plate, so that flexing of the curvilinear arm 66 accomplishes the desired overtravel function. The rod 68 preferably extends across a substantial portion of the width of the moveable plate 40, thereby insuring that the actuating force on the plate is uniformly distributed so that undesirable twisting of the plate does not occur due to unbalanced torque.

What is claimed is:

1. A capacitive keyswitch comprising a fixed, flat capacitor plate in a first plane, a moveable flat capacitor plate hinged at one end to project in a second plane and to move towards a parallel position with respect to said fixed plate when an actuating force is applied to said moveable plate, an actuating plunger for applying said force to said moveable plate, return means for returning said plunger to its unactuated position and a flexible, cantilever mounted, overtravel arm integrally formed on said plunger which carries contact means that engages said moveable plate after said plunger has been depressed by a predetermined amount.

2. The invention of claim 1 wherein said cantilever, mounted arm is curvilnear.

3. The keyswitch of claim 2 wherein said curvilinear mounted arm is shaped to substantially correspond to a segment of the circumference of a circle.

4. The keyswitch of claim 4 wherein said contact means is formed by an elongated cylindrical rod which extends beyond the curvilinear arm over a substantial portion of the width of said moveable plate.

* * * * *